United States Patent
Carey et al.

(10) Patent No.: US 7,298,597 B2
(45) Date of Patent: Nov. 20, 2007

(54) MAGNETORESISTIVE SENSOR BASED ON SPIN ACCUMULATION EFFECT WITH FREE LAYER STABILIZED BY IN-STACK ORTHOGONAL MAGNETIC COUPLING

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 353 days.

(21) Appl. No.: 11/093,342

(22) Filed: Mar. 29, 2005

(65) Prior Publication Data
US 2006/0221509 A1  Oct. 5, 2006

(51) Int. Cl.
G11B 5/39 (2006.01)
G11B 5/127 (2006.01)
(52) U.S. Cl. .................................... 360/324.2
(58) Field of Classification Search ............. 360/324.2, 360/324.1, 324.11, 324.12
See application file for complete search history.

(56) References Cited

U.S. PATENT DOCUMENTS

| 5,465,185 | A | 11/1995 | Heim et al. | |
|---|---|---|---|---|
| 5,757,056 | A | 5/1998 | Chui | |
| 6,023,395 | A | 2/2000 | Dill et al. | |
| 6,473,279 | B2 | 10/2002 | Smith et al. | |
| 6,704,175 | B2 * | 3/2004 | Li et al. | 360/324.11 |
| 6,710,984 | B1 * | 3/2004 | Yuasa et al. | 360/324.11 |
| 6,714,388 | B2 * | 3/2004 | Hasegawa et al. | 360/324.11 |
| 7,023,670 | B2 * | 4/2006 | Saito | 360/324.12 |
| 7,199,984 | B2 * | 4/2007 | Carey et al. | 360/324.12 |
| 2002/0167768 | A1 * | 11/2002 | Fontana et al. | 360/324.2 |
| 2003/0017364 | A1 | 1/2003 | Kikitsu et al. | |
| 2003/0137781 | A1 * | 7/2003 | Carey et al. | 360/324.2 |
| 2004/0109264 | A1 * | 6/2004 | Gill | 360/324.2 |
| 2004/0257714 | A1 | 12/2004 | Takahashi et al. | |
| 2005/0002128 | A1 | 1/2005 | Ito et al. | |
| 2005/0146812 | A1 * | 7/2005 | Fontana et al. | 360/324.2 |
| 2005/0207073 | A1 * | 9/2005 | Carey et al. | 360/324.12 |
| 2006/0044707 | A1 * | 3/2006 | Araki et al. | 360/324.12 |

(Continued)

OTHER PUBLICATIONS

Tanaka et al., "Spin-valve heads in the current-perpendicular-to-plane mode for ultrahigh-density recording", IEEE Transactions on Magnetics, 38 (1): 84-88 Part 1 Jan. 2002.

(Continued)

*Primary Examiner*—Brian E. Miller
(74) *Attorney, Agent, or Firm*—Thomas R. Berthold

(57) ABSTRACT

A magnetoresistive sensor based on the spin accumulation effect has an in-stack biasing structure with a ferromagnetic biasing layer that is magnetically-coupled orthogonally with the sensor free ferromagnetic layer across a spacer layer. The sensor has an electrically conductive strip with a first tunnel barrier and a free ferromagnetic layer on the front or sensing end of the strip and second tunnel barrier and a fixed ferromagnetic layer on the back end of the strip. A magnetically-coupling spacer layer is formed on the free layer and the ferromagnetic biasing layer is formed on the spacer layer. The magnetically-coupling layer induces direct orthogonal magnetic coupling between the in-plane magnetization directions of the biasing layer and the free layer.

22 Claims, 5 Drawing Sheets

U.S. PATENT DOCUMENTS

2006/0103991 A1* 5/2006 Hoshino et al. ....... 360/324.12

OTHER PUBLICATIONS

Maat et al., "90• coupling induced by exchange biasing in PtMn/CoFe10/CoFe2O4/CoFe10 films", J. Appl. Phys., vol. 93, pp. 7229-7231 (2003).

Slonczewski, "Overview of interlayer exchange theory", Journal of Magnetism and Magnetic Materials, 150 (1995) 13-24.

Jedema et al., "Electrical detection of spin precession in a metallic mesoscopic spin valve", Nature, vol. 416, Apr. 2002, pp. 713-716.

George et al., "Direct measurement of spin accumulation in a metallic mesoscopic structure", Physical Review of B 67, 012410 (2003).

* cited by examiner

MAGNETORESISTIVE SENSOR BASED ON SPIN ACCUMULATION EFFECT WITH FREE LAYER STABILIZED BY IN-STACK ORTHOGONAL MAGNETIC COUPLING

RELATED APPLICATION

This application is related to application Ser. No. 10/802,639 filed Mar. 16, 2004, now U.S. Pat. No. 7,199,984 B2, and titled "CURRENT-PERPENDICULAR-TO-PLANE MAGNETORESISTIVE SENSOR WITH FREE LAYER STABILIZED BY IN-STACK ORTHOGONAL MAGNETIC COUPLING".

BACKGROUND OF THE INVENTION

1. Field of the Invention

This invention relates generally to magnetoresistive (MR) sensors, such as MR read heads for magnetic recording disk drives, and more particularly to MR sensors based on the spin accumulation effect.

2. Description of the Related Art

One type of conventional MR sensor, often called a "spin-valve" (SV) sensor, has a stack of layers that include two ferromagnetic layers separated by a nonmagnetic spacer layer. One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance. The SV MR read head used in all current magnetic recording hard disk drives operates with the sense current directed parallel to the planes of the layers in the sensor layer stack, so it is referred to as a current-in-the-plane (CIP) sensor. In a disk drive CIP-SV read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance.

A type of MR read head based on a magnetic tunnel junction (MTJ) has been proposed. In an MTJ MR read head the nonmagnetic spacer layer between the free and fixed ferromagnetic layers is a nonmagnetic tunnel barrier layer, typically formed of alumina. The MTJ MR read head operates with tunneling current perpendicular to the planes (CPP) of the layers in the sensor stack, and the tunneling current that passes perpendicularly through the layers depends on the relative orientation of the magnetizations in the two ferromagnetic layers.

A type of MR sensor and read head based on "spin accumulation" has been proposed in US 2005/0002128 A1 and US 2004/0257714 A1. This type of sensor is based on the experimental results published by F. J. Jedema et al., "Electrical detection of spin precession in a metallic mesoscopic spin valve", *Nature*, Vol. 416, April 2002, pp. 713-716. This type of MR sensor has an electrically conductive strip with a first tunnel barrier and a free ferromagnetic layer on the front or sensing end of the strip and second tunnel barrier and a fixed ferromagnetic layer on the back end of the strip. When current is passed from the fixed ferromagnetic layer through the second tunnel barrier into the back end of the strip and the fixed ferromagnetic layer is magnetized in a direction so that the number of spin up electrons in that layer is higher than the number of spin-down electrons, then spin-up electrons accumulate below the second tunnel barrier. However since the strip is nonmagnetic the degree of the spin-accumulation decays exponentially with a characteristic length scale equal to the spin diffusion length of the of the electrons in the strip material. If the front end of the strip is located at a distance about equal to or shorter than the spin diffusion length then the spin accumulation is detected as a voltage across the front end. This voltage depends on the direction of magnetization of the free ferromagnetic layer so that when the free layer is exposed to an external magnetic field the electrical resistance across the first tunnel barrier changes.

For maximum read-head stability and output-linearity without hysteresis in the MR read head based on the spin accumulation effect, the magnetization of the free layer should be maintained in a saturated single domain state in the absence of an external magnetic field. In such a state, the local magnetization everywhere in the free layer, including the ends or side edges, is essentially "longitudinal", i.e., along the length of the free layer and the cross-track direction of the head and parallel to the plane of the magnetic recording medium. The previously-cited references propose longitudinal biasing of the free layer by either ferromagnetic biasing layers located on opposite sides of the free layer or a ferromagnetic biasing layer located in the sensor stack and magnetostatically coupled with the free layer across a nonmagnetic spacer layer. The proposed in-stack biasing approach requires a second antiferromagnetic layer in the sensor to exchange-couple the biasing layer and thus a second annealing step in the presence of an applied field to set the magnetization direction of the biasing layer.

What is needed is an MR sensor based on the spin accumulation effect with improved in-stack biasing of the sensor free ferromagnetic layer.

SUMMARY OF THE INVENTION

The invention is an MR sensor based on the spin accumulation effect that includes an in-stack biasing structure with a ferromagnetic biasing layer that is magnetically-coupled orthogonally with the sensor free ferromagnetic layer across a spacer layer. The sensor has an electrically conductive strip with a first tunnel barrier and a free ferromagnetic layer on the front or sensing end of the strip and second tunnel barrier and a fixed ferromagnetic layer on the back end of the strip. A magnetically-coupling spacer layer is formed on the free layer and the ferromagnetic biasing layer is formed on the spacer layer. The magnetically-coupling layer induces direct orthogonal magnetic coupling between the in-plane magnetization directions of the biasing layer and the free layer.

An antiferromagnetic layer is used to exchange-couple the biasing layer to fix its in-plane magnetization direction parallel to the in-plane magnetization direction of the sensor fixed ferromagnetic layer. Because the magnetization directions of the biasing and fixed layers in the sensor are parallel, a single annealing step is used to set their magnetization directions. This allows the same antiferromagnetic material to be used for both the antiferromagnetic layer that exchange-couples the biasing layer and the antiferromagnetic layer that exchange-couples the fixed layer.

The spacer layer that induces the orthogonal magnetic coupling can be an XMn alloy, where X is Pt, Ni, Fe, Ir, Pd or Rh; elemental Cr or Mn; a rare-earth transition-metal alloy, such as TbFe, ThCo, GdFe and GdCo; or a nonmagnetic transition metal, such as Cu, Ru, Ir, Rh and Os. Preferably the magnetically-coupling layer is PtMn having a thickness between approximately 15 and 50 Å.

For a fuller understanding of the nature and advantages of the present invention, reference should be made to the following detailed description taken together with the accompanying figures.

DETAILED DESCRIPTION OF THE INVENTION

Prior Art

The sensor of this invention can be used as a magnetoresistive (MR) read head for magnetic recording disk drives and thus the operation of a conventional disk drive will be briefly described with reference to FIGS. 1-3. However, the sensor of this invention is fully applicable as a magnetic field sensor and as a read head for magnetic recording media other than magnetic recording disks.

Figure 1:
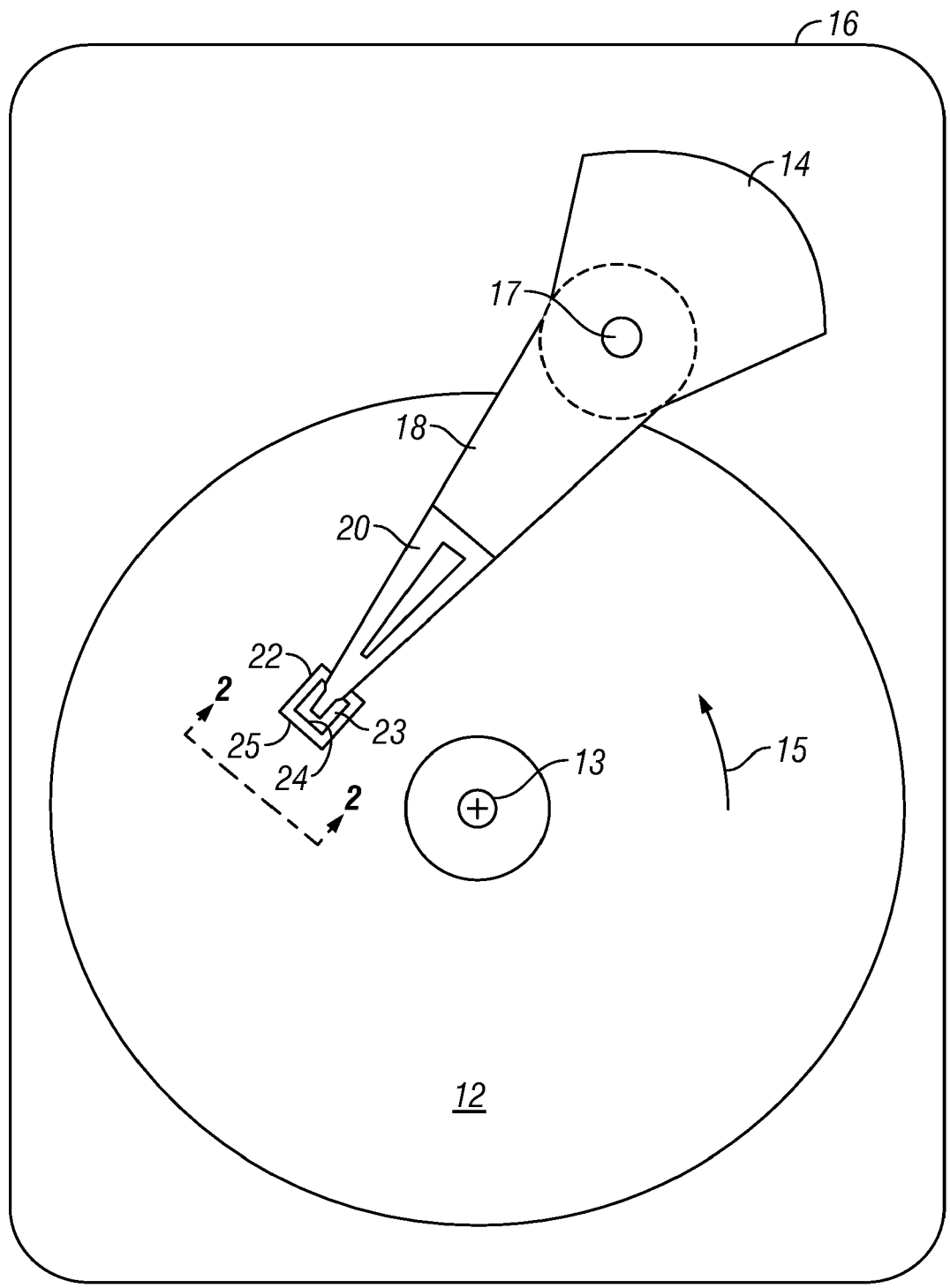
FIG. 1 is a schematic top view of a conventional magnetic recording hard disk drive with the cover removed.

FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
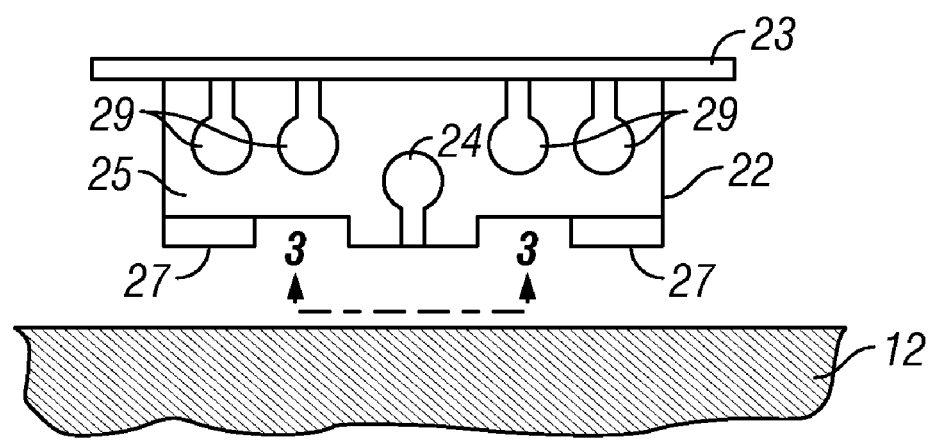
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and an end face or trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the slider's trailing surface 25 and is connected to the disk drive read/write electronics by electrical connection to terminal pads 29 on the trailing surface 25.

Figure 3:
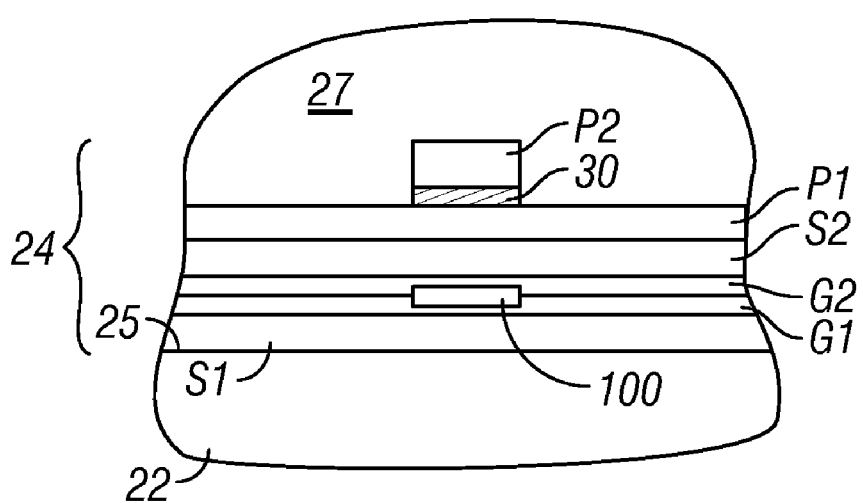
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 on ABS 27 as viewed from the disk 12. The read/write head 24 is a series of thin films deposited and lithographically patterned on slider 22. Slider 22 is typically a wafer of ceramic material, such as a composite of alumina ($Al_2O_3$) and titanium carbide (TiC), or silicon. The write head includes magnetic write poles P1 and P2 separated by a write gap 30. The MR sensor or read head 100 is located between two insulating gap layers G1, G2 that are typically formed of alumina. Gap layers G1, G2 are located between magnetic shields S1 and S2 that are typically formed of permalloy (NiFe) or sendust (FeAlSi).

Figure 4A:
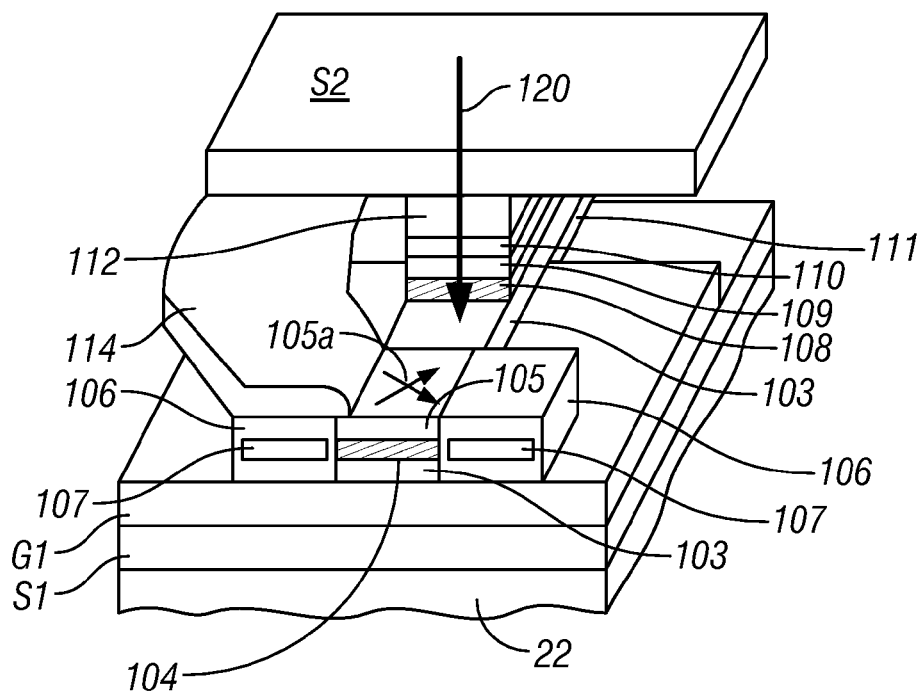
FIGS. 4A-4B illustrate perspective and side-sectional view, respectively, of a prior art magnetoresistive read head based on the spin accumulation effect.
Figure 4B:
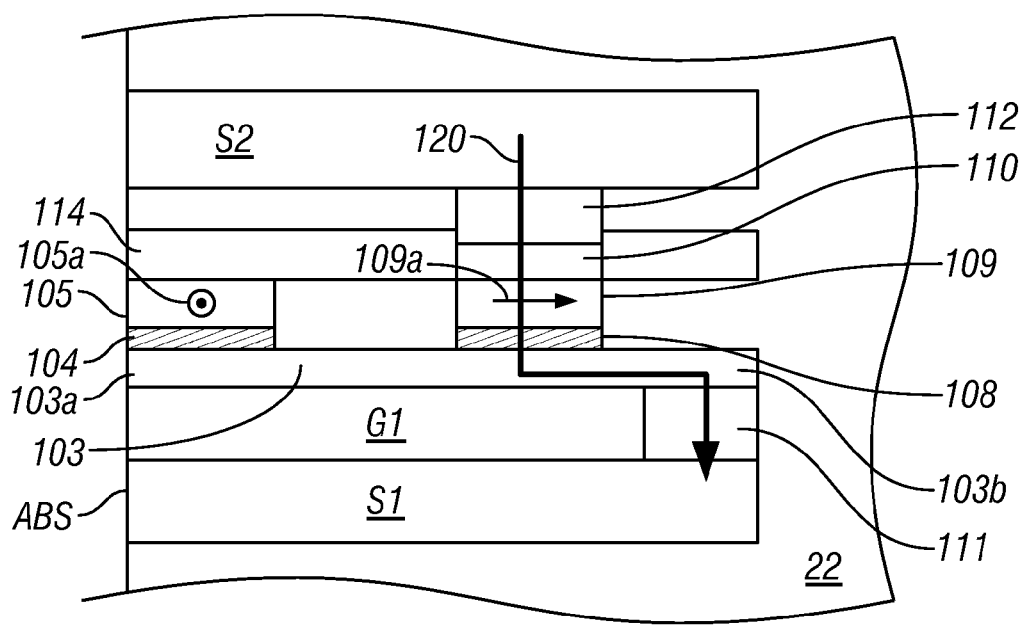

FIGS. 4A-4B illustrate perspective and side-sectional view, respectively, of the MR read head based on the spin accumulation effect as described in US 2005/0002128 A1. The substrate for the read head is the body of slider 22 with S1 formed on it and G1 formed on S1. The head includes an electrically conductive strip 103 that has a first or sensing end 103a near the ABS and a second or back end 103b recessed from the ABS. The strip 103 is formed of electrically conducting material, such as aluminum (Al) or semiconductor material like GaAs. A first tunnel barrier 104 is deposited on the first end 103a, and a second tunnel barrier 108 is deposited on the second end 103b. The tunnel barrier material is typically alumina, magnesium oxide (MgO) or any of the well-known materials proposed for use in magnetic tunnel junction devices.

At the first or sensing end of the read head a first or sensing ferromagnetic layer 105 is formed on first tunnel barrier 104. The sensing ferromagnetic layer 105 has its in-plane magnetic moment or magnetization direction 105a oriented generally parallel to the ABS in the absence of an external magnetic field, i.e., magnetic fields from recorded data in the magnetic recording layer of the disk. The sensing ferromagnetic layer 105 is called the "free" layer because its magnetization direction 105a is free to rotate in the presence of magnetic fields from the recorded data. At the second or back end of the read head a second or "fixed" ferromagnetic layer 109 is formed on the second tunnel barrier 108. The fixed ferromagnetic layer 109 has its in-plane magnetic moment or magnetization direction 109a oriented substantially orthogonal to the ABS and prevented from rotation in the presence of magnetic fields in the range of interest, i.e., magnetic fields from the recorded data. The fixed ferromagnetic layer 109 is typically exchange-coupled with an antiferromagnetic layer 110 that results in the magnetization direction 109a of fixed ferromagnetic layer 109 being fixed or "pinned" from rotation in the presence of magnetic fields from the recorded data. The fixed layer 109 can also be the well-known antiparallel-pinned (AP-pinned) structure, also called a "laminated" pinned layer, as described in U.S. Pat. No. 5,465,185. The AP-pinned structure comprises a ferromagnetic pinned layer, a non-magnetic spacer layer and a ferromagnetic reference layer.

The free layer 105 and fixed layer 109 are typically formed of an alloy of one or more of Co, Fe and Ni, or a bilayer of two alloys, such as a CoFe—NiFe bilayer. The antiferromagnetic layer 110 is typically formed of a sufficiently thick Mn alloy layer (PtMn, NiMn, FeMn, IrMn, PdMn, PtPdMn or RhMn). A PtMn layer needs to be thicker than approximately 100 Å to become chemically-ordered and antiferromagnetic when annealed, and an IrMn layer is antiferromagnetic as deposited when it is thicker than approximately 40 Å. These antiferromagnetic Mn alloys may also include small amounts of additional elements, such as Cr, V, Pt, Pd and Ni that are typically added to improve corrosion resistance or increase electrical resistance.

As shown in FIG. 4A, "hard" or relatively high coercivity ferromagnets 107, such as CoPt or CoCrPt, are located on either side of the free ferromagnetic layer 105 and separated from it by insulating material 106. The ferromagnets 107 provide a longitudinal biasing magnetic field to stabilize the magnetization of the free layer 105 longitudinally in the direction parallel to the ABS and linearize the output of the read head.

As an alternative to the hard-biasing structure of ferromagnets 107 and insulating material 106 located on the sides of the free layer 105, in-stack longitudinal biasing has been proposed for MR sensors based on the spin accumulation effect, as suggested in US 2004/0257714 A1. In this approach a ferromagnetic biasing layer with an in-plane magnetization direction parallel to the in-plane magnetization of the free layer 105 is formed on a nonmagnetic spacer on the free layer 105 and an antiferromagnetic layer is formed on the ferromagnetic biasing layer to fix its magnetization direction by exchange-coupling. Because the magnetization direction 109a of the fixed layer 109 is orthogonal to the magnetization direction of the in-stack biasing layer, two annealing steps are required to set the two orthogonal magnetization directions for the free layer 105 and the in-stack biasing layer. This requires that the two antiferromagnetic layers must either be made of different materials or of the same material with different thickness to ensure that the two antiferromagnetic layers have different blocking temperatures.

As shown in FIG. 4B, electrical contacts or leads 111, 112 are located below and above, respectively, the back end of the head. The back end of the head is connected to circuitry (not shown) that directs current (depicted by arrow 120) through the fixed ferromagnetic layer 109, second tunnel barrier 108 and the back end 103b of strip 103. At the front end of the head an electrical lead 114 is in contact with free ferromagnetic layer 105. Electrical-resistance-detection circuitry (not shown) coupled to lead 114 and the front end 103a of strip 103 detects the changes in electrical resistance across the first tunnel barrier 104. When current is passed through the back end of the head, the tunnel barrier 108 provides a high electron-spin-dependent resistance that enhances the spin polarization of the current injected into the back end 103b of the strip 103. Spin accumulation, i.e., unequal densities of spin-up and spin-down electrons, occurs in the strip 103, and diffuses along the length of the strip 103 to the front end 103a. This spin accumulation is detected by a voltage across the front end of the head. When the free layer 105 is exposed to external magnetic fields from the recorded data while current is passing at the back end of the sensor, the electrical resistance across the tunnel barrier 104 changes.

The Invention

Figure 5A:
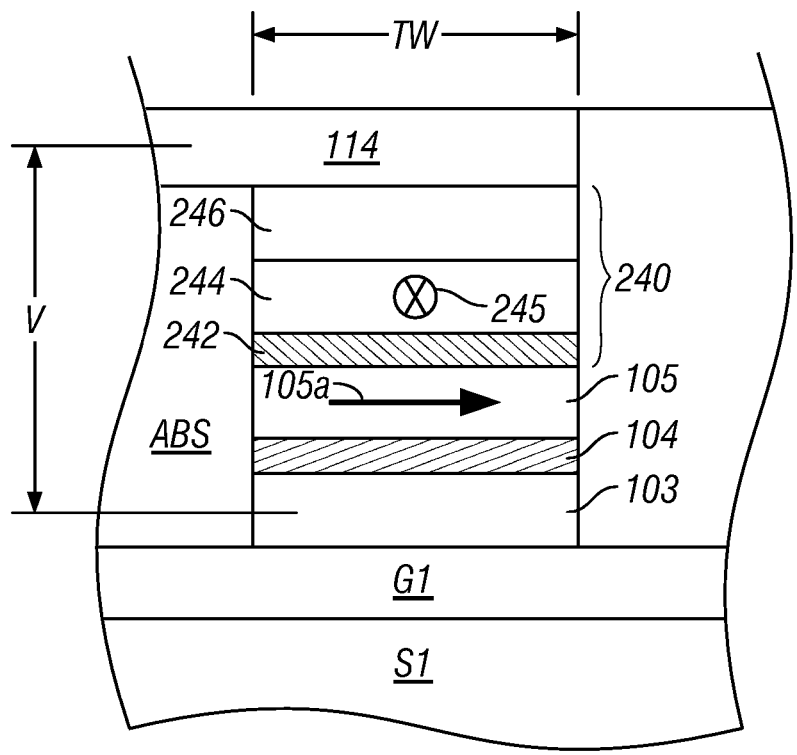
FIG. 5A is a view from of the air-bearing surface (ABS) end of the read head of this invention.
Figure 5B:
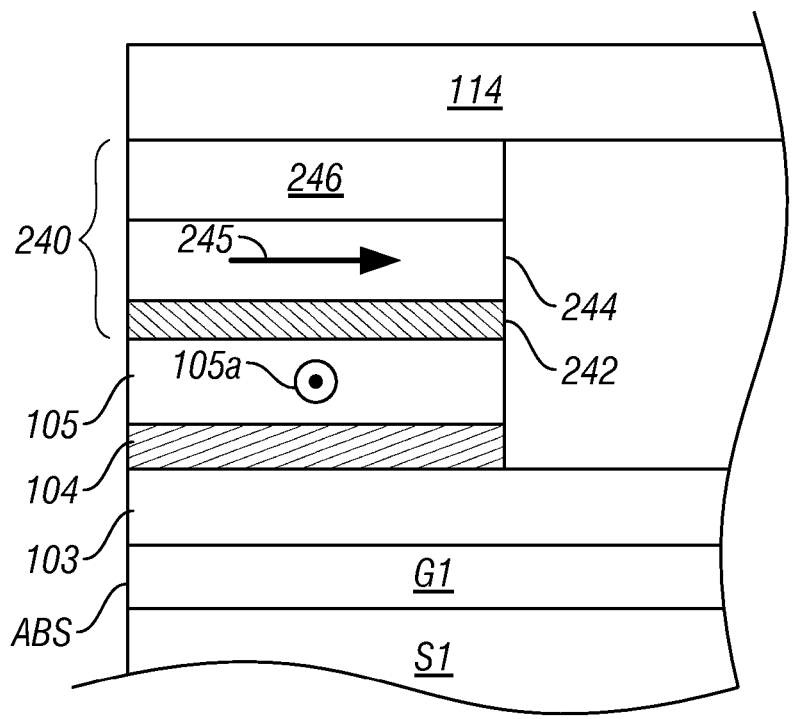
FIG. 5B is a side sectional view of the front or sensing end of the read head of this invention.
Figure 5C:
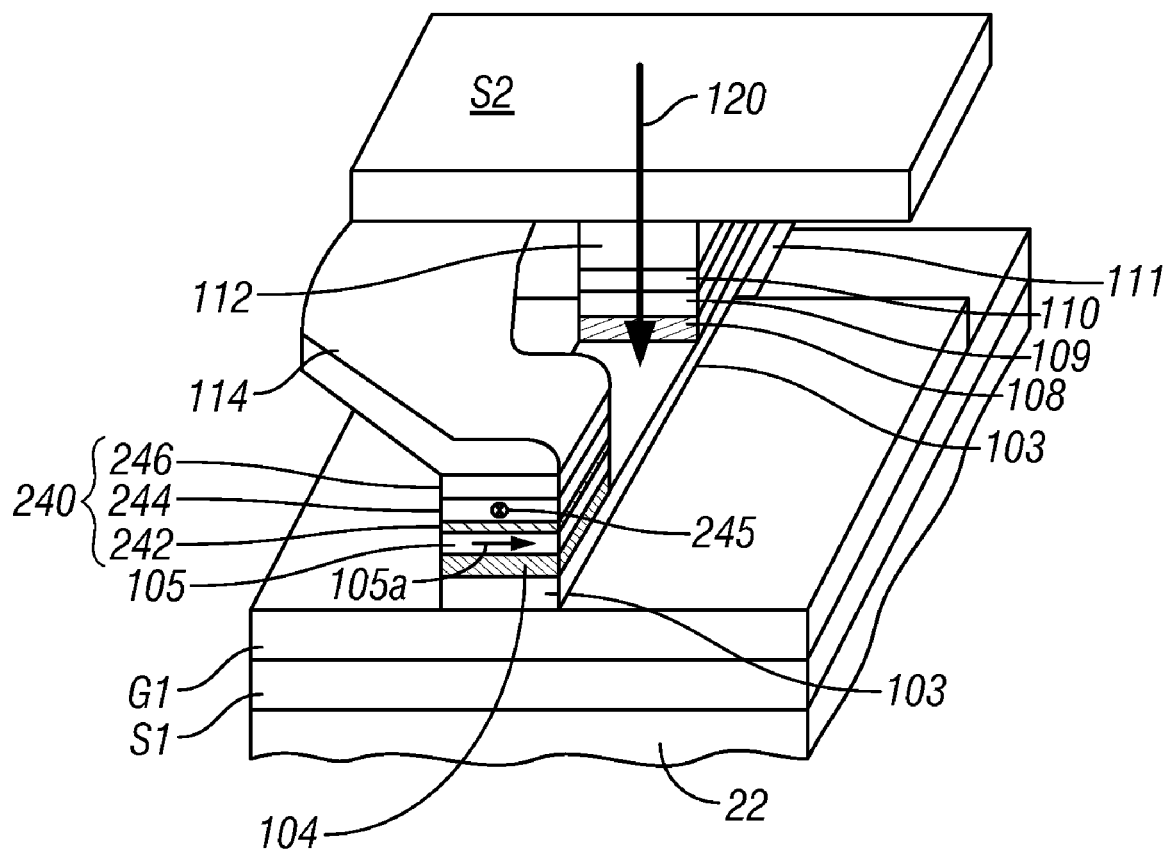
FIG. 5C is a perspective view of the read head of this invention.

FIG. 5A is a view from of the ABS end of the sensor of this invention, FIG. 5B is a side sectional view of the front or sensing end of the sensor of this invention, and FIG. 5C is a perspective view of the sensor of this invention. The sensor is substantially identical structurally to the prior art sensor described above, with the primary exception of a longitudinal bias stack 240 at the front end and the elimination of the ferromagnets 107 and insulating material 106.

The bias stack 240 includes a biasing ferromagnetic layer 244 that has an in-plane magnetic moment or magnetization direction 245 that is substantially orthogonal to the moment 105a of free layer 105 in the absence of an external magnetic field and substantially parallel to the moment 109a of fixed layer 109 (FIG. 4B). As used herein "substantially orthogonal" means that the two moments or magnetization directions are closer to orthogonal than parallel. An antiferromagnetic layer 246 is formed on biasing layer 244 and provides antiferromagnetic exchange-coupling to the biasing layer 244 to assure that its moment 245 will not rotate in the presence of an external magnetic field in the range of interest of the sensor, i.e, magnetic fields from recorded data in the magnetic recording layer of the disk. The magnetization direction 105a of free layer 105, in the absence of an external magnetic field, is caused to be orthogonal to the magnetization direction 245 of biasing layer 244 by direct orthogonal magnetic coupling induced by spacer layer 242 that acts as a magnetically-coupling layer. The layers 242, 244 and 246 in bias stack 240 have side walls that are contiguous with the side walls of the free layer 105 and thus are patterned to the trackwidth (TW) dimension.

The magnetization directions 245 of biasing layer 244 and 109a of fixed layer 109 (FIG. 4B) can be set in a single annealing step. This allows the antiferromagnetic layers 246 and 110 to be made of the same material. The easy axes of the biasing layer 244 and the free layer 105 initially are parallel to the magnetic field applied during deposition, i.e., parallel to the directions 245 and 109a. However, after annealing, the biasing layer 244 becomes exchange-biased with the antiferromagnetic layer 246 and the free layer 105 exhibits a 90-degree rotated easy axis, orthogonal to the annealing direction.

While the biasing layer 244 is depicted in FIGS. 5A-5B as a single layer, it can also be the well-known antiparallel-pinned (AP-pinned) structure, also called a "laminated" pinned layer. The AP-pinned biasing layer comprises a ferromagnetic pinned layer exchange-biased with antiferromagnetic layer 246, a non-magnetic spacer layer and a ferromagnetic reference layer.

The orthogonal magnetic coupling layer of free layer 105 to biasing layer 245 is induced by the spacer layer 242 that acts as a magnetically-coupling layer. The spacer layer 242 is preferably a generally equiatomic $Pt_{50}Mn_{50}$ layer having a thickness less than approximately 100 Å, preferably between approximately 15 Å and 50 Å. This thickness is well below the thickness at which $Pt_{50}Mn_{50}$ exhibits its antiferromagnetic exchange bias effect, which is typically at a thickness greater than approximately 100 Å.

Orthogonal magnetic coupling has been observed between two $Co_{90}Fe_{10}$ layers, in which the first $Co_{90}Fe_{10}$ layer is exchange-biased to a PtMn antiferromagnetic layer and the two $Co_{90}Fe_{10}$ layers are separated by a thin cobalt-ferrite ($CoFe_2O_4$) layer. S. Maat and B. Gurney, "90° coupling induced by exchange biasing in $PtMn/CoFe_{10}/CoFe_2O_4/CoFe_{10}$ films", J. Appl. Phys., Vol. 93, pp. 7229-7231 (2003). However, because cobalt-ferrite is an electrical insulator, structures incorporating it are generally not usable in sensors because of the increased resistance across the sensor stack.

The effect of direct orthogonal magnetic coupling has been demonstrated for various PtMn spacer layer thicknesses, as described in detail in the previously-cited pending application. The magnetic coupling was very close to 90 degrees. Preferably the magnetic coupling induced by the spacer layer should be approximately orthogonal, e.g., between approximately 80 and 100 degrees. In one test structure a 40 Å $Ni_{80}Fe_{20}$ free layer was orthogonally biased across a 20 Å PtMn spacer layer by a 20 Å $Co_{80}Fe_{20}$ biasing layer that was exchange-coupled to an IrMn antiferromagnet.

A high anisotropy field $H_k$ from the biasing layer 244 is desirable to assure that the free layer 105 response is a linear function of the applied field. Typical fields from the recorded media are less than approximately 150 Oe, and conventional MR read heads have free layers with $H_k$ of only approximately 40 Oe or less, but the biasing field from the conventional hard bias layer (ferromagnets 107 in FIG. 4A) creates a unidirectional anisotropy field of similar magnitude (200-400 Oe). In this invention experimental results from test structures show that free layers with orthogonal bias can achieve $H_k$ higher than approximately 300 Oe for PtMn spacer layer thicknesses of approximately 20 Å and $H_k$ higher than approximately 400 Oe for PtMn spacer layer thicknesses of approximately 15 Å.

To obtain orthogonal coupling between the biasing layer and the free layer the biasing layer should have a fixed magnetization direction in low externally applied magnetic fields as it is created through exchange biasing with an antiferromagnet. Alternatively, a hard magnet with high remanence may be used as the biasing layer since its magnetization will also be fixed in externally applied magnetic fields lower than its coercive field. Thus the biasing layer may be formed of a CoPt alloy like $Co_{100-x-y}Pt_xCr_y$, where x is in the range of 10 to 35 atomic % and y is in the range of 0 to 5 atomic %.

The electrically-conducting magnetically-coupling spacer layer needs to exhibit some degree of antiferromagnetic interactions to invoke orthogonal coupling in the second ferromagnetic layer due to interfacial spin-frustration. Accordingly the spacer layer can be an antiferromagnetic or ferrimagnetic material. However the spacer layer should be below the critical thickness where it exhibits exchange-bias interaction with the adjacent ferromagnetic layers. The orthogonal coupling then is a result of energy minimization. Thus the materials described below are also believed suitable for use as the spacer layer.

Other Mn alloys may be suitable for use as the spacer layer providing orthogonal magnetic coupling provided they have thicknesses below which they exhibit the effect of antiferromagnetic exchange-biasing. These other Mn alloys include NiMn, FeMn, IrMn, PdMn, PtPdMn and RhMn. These Mn alloys may also include small amounts of additional elements, such as Cr, V, Pt, Pd and Ni that are typically added to improve corrosion resistance or increase electrical resistance.

Elementary Cr or Mn may also be suitable for use as the spacer layer. Thin layers of either element do not exhibit exchange-bias interaction with an adjacent ferromagnetic layer although they exhibit antiferromagnetic order.

Certain electrically-conducting ferrimagnetic materials, such as the rare-earth transition-metal alloys, may also be suitable for use as the spacer layer. These include TbFe, ThCo, GdFe and GdCo.

In addition to the above materials for the magnetically-coupling spacer layer, all of which exhibit antiferromagnetic interactions, certain non-magnetic transition metals that induce an electron-mediated indirect exchange coupling (RKKY coupling) may also be suitable because the exchange interaction can oscillate between antiferromagnetic and ferromagnetic values as a function of the spacer thickness. Therefore if the microstructure of the layers was made such that the local thickness of the spacer layer is rapidly fluctuating, both antiferromagnetic and ferromagnetic values may coexist on a scale smaller than the ferromagnetic domain wall width. This case is magnetically similar to an antiferromagnetic spacer and will therefore also induce frustration leading to orthogonal coupling of the ferromagnetic layers. These non-magnetic spacer materials include Cu, Ru, Ir, Rh, and Os. See J. C. Slonczewski, "Overview of interlayer exchange theory", *Journal of Magnetism and Magnetic Materials*, 150 (1995) 13-24.

In the embodiment described above the biasing ferromagnetic layer was exchange biased to an antiferromagnetic layer. However, as described above, the biasing ferromagnetic layer may also be a hard ferromagnet, such as CoPt or CoCrPt, in which case an antiferromagnetic layer would not be required.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor capable of sensing external magnetic fields comprising:
   a substrate;
   an electrically conductive strip on the substrate and having first and second ends;
   a first tunnel barrier on the strip at the first end;
   a free ferromagnetic layer on the first tunnel barrier and having an in-plane magnetization direction oriented substantially in a first direction in the absence of an external magnetic field, said free layer magnetization direction being substantially free to rotate in the presence of an external magnetic field;
   a ferromagnetic biasing layer magnetically-coupled to the free layer and having an in-plane magnetization direction oriented substantially orthogonal to said first direction in the absence of an external magnetic field; and
   an electrically-conducting spacer layer between the biasing and free layers, the spacer layer between the biasing and free layers inducing substantial orthogonal magnetic coupling of the free layer to the biasing layer;
   a second tunnel barrier on the strip at the second end; and
   a fixed ferromagnetic layer on the second tunnel barrier and having an in-plane magnetization direction oriented in a second direction substantially orthogonal to said first direction and substantially prevented from rotation in the presence of an applied magnetic field.

2. The sensor of claim 1 further comprising electrical leads connecting the fixed ferromagnetic layer and the second end of the strip, the leads permitting electrical current to be directed through the fixed ferromagnetic layer and the second tunnel barrier into the second end of the strip.

3. The sensor of claim 1 farther comprising a first antiferromagnetic layer exchange-coupled with the biasing layer for substantially preventing rotation of the magnetization direction of the biasing layer in the presence of an external magnetic field.

4. The sensor of claim 3 wherein the biasing ferromagnetic layer is an antiparallel-pinned layer.

5. The sensor of claim 1 wherein the biasing ferromagnetic layer is a hard ferromagnet having a magnetization direction substantially prevented from rotation in the presence of an applied magnetic field.

6. The sensor of claim 5 wherein the hard ferromagnet comprises a $Co_{1-x-y}Pt_xCr_y$ alloy, where x is in the range of 10 to 35 atomic % and y is in the range of 0 to 5 atomic %.

7. The sensor of claim 1 further comprising a second antiferromagnetic layer exchange-coupled with the fixed layer for substantially preventing rotation of the magnetization direction of the fixed layer in the presence of an external magnetic field.

8. The sensor of claim 7 wherein the fixed layer is an antiparallel-pinned layer.

9. The sensor of claim 1 wherein the sensor is a magnetoresistive read head for reading magnetically recorded data from tracks on a magnetic recording medium, wherein the substrate is a first shield formed of magnetically permeable material and having a substantially horizontal planar surface, wherein the free layer has substantially vertical side walls defining a sensor trackwidth less than the width of the first shield, and wherein the biasing layer and the spacer layer have side walls substantially contiguous with the side wall of the free layer.

10. The sensor of claim 1 wherein the spacer layer between the biasing and free layers is a material selected from the group consisting of (a) an alloy comprising X and Mn, wherein X is selected from the group consisting of Pt, Ni, Fe, Ir, Pd and Rh; (b) a material consisting essentially of Cr or Mn; (c) a rare-earth transition-metal alloy selected from the group consisting of TbFe, TbCo, GdFe and GdCo; and (d) a transition-metal alloy selected from the group consisting of Cu, Ru, Rh, Ir and Os.

11. The sensor of claim 10 wherein the spacer layer between the biasing and free layers is a PtMn alloy having a thickness less than approximately 100 Angstroms.

12. The sensor of claim 11 wherein the PtMn alloy comprises a PtMn alloy with Pt between approximately 25 and 75 atomic percent.

13. A magnetoresistive read head for reading magnetically recorded data from tracks on a magnetic recording medium, the head comprising:
   a substrate;
   a first shield of magnetically permeable material on the substrate and having a substantially horizontal planar surface;
   an electrically conductive strip on the substrate and having a sensing end and a back end;
   a first tunnel barrier on the strip at the sensing end;
   a free ferromagnetic layer on the first tunnel barrier and having an in-plane magnetization direction oriented substantially in a first direction in the absence of an external magnetic field, said free layer magnetization direction being substantially free to rotate in the presence of an external magnetic field from the recording medium;
   a ferromagnetic biasing layer magnetically-coupled to the free layer and having an in-plane magnetization direction oriented substantially orthogonal to said first direction in the absence of an external magnetic field;
   an electrically-conducting magnetically-coupling layer between the biasing and free layers, the magnetically-coupling layer between the biasing and free layers inducing substantial orthogonal magnetic coupling of the free layer to the biasing layer;
   a second tunnel barrier on the strip at the second end;
   a pinned ferromagnetic layer on the second tunnel barrier and having an in-plane magnetization direction oriented in a second direction substantially orthogonal to said first direction and substantially prevented from rotation in the presence of a magnetic field from the recording medium;
   circuitry connected to the pinned layer and the second end of the strip for passing electrical current through the pinned layer and the second tunnel barrier into the second end of the strip; and
   electrical-resistance-detecting circuitry connected to the free layer and the first end of the strip for detecting changes in electrical resistance across the first tunnel barrier in response to external magnetic fields from the recording medium when current is passing at the second end of the strip.

14. The head of claim 13 further comprising a first antiferromagnetic layer exchange-coupled with the biasing layer for substantially preventing rotation of the magnetization direction of the biasing layer in the presence of a magnetic field from the recording medium.

15. The head of claim 14 wherein the biasing ferromagnetic layer is an antiparallel-pinned layer.

16. The head of claim 13 wherein the biasing ferromagnetic layer is a hard ferromagnet having a magnetization direction substantially prevented from rotation in the presence of a magnetic field from the recording medium.

17. The head of claim 13 further comprising a second antiferromagnetic layer exchange-coupled with the pinned layer for substantially preventing rotation of the magnetization direction of the pinned layer in the presence of a magnetic field from the recording medium.

18. The head of claim 13 wherein the free layer has substantially vertical side walls defining a head trackwidth less than the width of the first shield, and wherein the biasing layer and spacer layer have side walls substantially contiguous with the side walls of the free layer.

19. The head of claim 18 further comprising a first antiferromagnetic layer exchange-coupled with the biasing layer for substantially preventing rotation of the magnetization direction of the biasing layer in the presence of a magnetic field from the medium, the first antiferromagnetic having side walls substantially contiguous with the side walls of the free layer.

20. The head of claim 13 wherein the magnetically-coupling layer is a material selected from the group consisting of (a) an alloy comprising X and Mn, wherein X is selected from the group consisting of Pt, Ni, Fe, Ir, Pd and Rh; (b) a material consisting essentially of Cr or Mn; (c) a rare-earth transition-metal alloy selected from the group consisting of TbFe, TbCo, GdFe and GdCo; and (d) a transition-metal alloy selected from the group consisting of Cu, Ru, Rh, Ir and Os.

21. The head of claim 13 wherein the spacer layer between the biasing and free layers is a PtMn alloy having a thickness less than approximately 100 Angstroms.

22. The head of claim 21 wherein the magnetically-coupling layer has a thickness between approximately 15 and 50 Angstroms and comprises a PtMn alloy with Pt between approximately 25 and 75 atomic percent.

* * * * *